(12) United States Patent  (10) Patent No.: US 9,197,234 B1
Yamashita  (45) Date of Patent: Nov. 24, 2015

(54) READOUT CIRCUIT AND METHOD OF USING THE SAME

(71) Applicant: TAIWAN SEMICONDUCTOR MANUFACTURING COMPANY, LTD., Hsinchu (TW)

(72) Inventor: Yuichiro Yamashita, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/277,487

(22) Filed: May 14, 2014

(51) Int. Cl.
*H03M 1/12* (2006.01)
*H04N 5/367* (2011.01)
*H04N 5/378* (2011.01)
*H03M 1/00* (2006.01)
*H01L 27/146* (2006.01)
*H04N 9/04* (2006.01)
*H04N 5/335* (2011.01)

(52) U.S. Cl.
CPC .......... *H03M 1/122* (2013.01); *H01L 27/14643* (2013.01); *H03M 1/00* (2013.01); *H03M 1/12* (2013.01); *H04N 5/335* (2013.01); *H04N 5/367* (2013.01); *H04N 5/378* (2013.01); *H04N 9/045* (2013.01)

(58) Field of Classification Search
CPC .......... H03M 1/00; H03M 1/12; H04N 9/045; H04N 5/367; H04N 5/335; H04N 5/378; H01L 27/14643
USPC ............... 341/155, 122; 348/222.1, 294, 300, 348/246; 250/208.1
See application file for complete search history.

(56) References Cited

U.S. PATENT DOCUMENTS

2012/0205520 A1 8/2012 Hsieh et al.
2013/0256512 A1* 10/2013 Shioya ...................... 250/208.1

* cited by examiner

*Primary Examiner* — Joseph Lauture
(74) *Attorney, Agent, or Firm* — Hauptman Ham, LLP

(57) ABSTRACT

A readout circuit includes a first analog circuit for receiving an output of a first sub-array of a pixel array, wherein the first analog circuit is configured to output a first analog signal. The readout circuit further includes a second analog circuit for receiving an output of a second sub-array of the pixel array, wherein the second sub-array comprises at least one pixel on a same row of the pixel array as at least one pixel of the first sub-array, and the second analog circuit is configured to output a second analog signal. The readout circuit further includes a first digital circuit for receiving the first analog signal and to convert the first analog signal to a first digital signal, wherein the first digital circuit is further configured to receive the second analog signal and to convert the second analog signal to a second digital signal.

20 Claims, 13 Drawing Sheets

READOUT CIRCUIT AND METHOD OF USING THE SAME

BACKGROUND

Image sensors provide a grid of pixel unit cells for recording an intensity or brightness of incident light. In some applications, each pixel unit cell responds to the incident light by accumulating charge carriers (such as electrons and/or holes) generated when the incident light passes into/through a silicon layer. The greater intensity or brightness of the incident light, the more charge carriers are generated.

The charge carriers are received by a readout circuit and converted into an electrical signal subsequently usable by another circuit to provide color and/or brightness information for suitable applications, such as cameras. Light sensing elements and readout circuits are usable in a charge-coupled device (CCD), a complementary metal oxide semiconductor (CMOS) image sensor (CIS), an active-pixel sensor (APS), a passive-pixel sensor or other light detecting devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
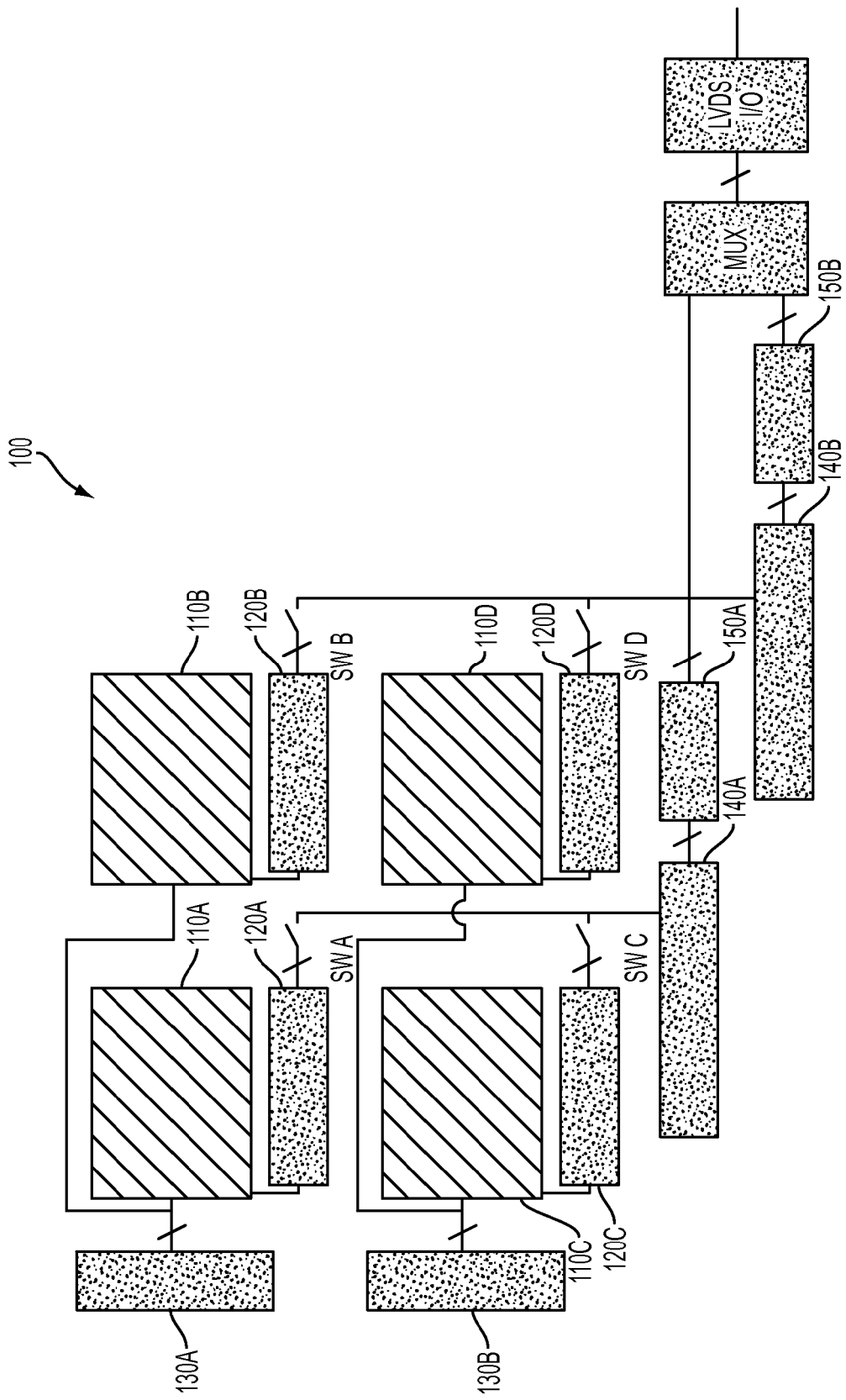
FIG. 1 is a schematic diagram of a readout circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a readout circuit 100 in accordance with some embodiments. Readout circuit 100 includes sub-arrays 110A, 110B, 110C and 110D. Each sub-array 110A, 110B, 110C and 110D includes segmented columns and segmented rows. A sub-array is a collection of light receiving elements, e.g., pixels, including at least two light receiving elements in a same row. Each sub-array 110A, 110B, 110C and 110D is configured to receive incident electromagnetic radiation and to convert the received electromagnetic radiation into an electrical charge. Each sub-array 110A, 110B, 110C and 110D is connected to a multiplying digital to analog converter (MDAC) 120A, 120B, 120C and 120D. Readout circuit 100 also includes vertical scanners 130A and 130B. Vertical scanner 130A is connected to both sub-array 110A and sub-array 110B. Vertical scanner 130B is connected to both sub-array 110C and sub-array 110D. Each vertical scanner 130A and 130B is configured to selectively activate a row of pixels in a sub-array.

Readout circuit 100 further includes digital memories 140A and 140B. Digital memory 140A is configured to selectively receive an output from MDAC 120A and from MDAC 120C. Digital memory 140B is configured to selective receive an output from MDAC 120B and MDAC 120D. Switch SWA is configured to selectively connect MDAC 120A to digital memory 140A. Switch SWC is configured to selectively connect MDAC 120C to digital memory 140A. Switch SWB is configured to selectively connect MDAC 120B to digital memory 140B. Switch SWD is configured to selectively connect MDAC 120D to digital memory 140B.

Readout circuit 100 further includes error correction circuits (ECC) 150A and 150B. ECC 150A is configured to receive an output from digital memory 140A. ECC 150B is configured to receive an output from digital memory 140B. A multiplexer MUX is configured to receive an output of both ECC 150A and ECC 150B. A low voltage differential signal input/output circuit LVDS I/O is configured to receive an output of multiplexer MUX. LVDS I/O is configured to transfer an output of readout circuit 100 to external circuitry.

In some embodiments, readout circuit 100 is part of a three dimensional integrated circuit (3DIC). Sub-arrays 110A, 110B, 110C and 110D are each on a same layer of the 3DIC. MDACs 120A, 120B, 120C and 120D are each on a separate layer of the 3DIC from sub-arrays 110A, 110B, 110C and 110D. Positioning sub-arrays 110A, 110B, 110C and 110D and MDACs 120A, 120B, 120C and 120D on separate layers of a 3DIC reduces a length of a conductive element between the sub-array and the corresponding MDAC in comparison with readout circuits which include sub-arrays and MDACs on a same layer of a 3DIC. The reduced length of the conductive element decreases parasitic capacitance of the conductive element which reduces interference with performance of circuitry within readout circuit 100.

In some embodiments, vertical scanners 130A and 130B are independently on a same layer of the 3DIC as sub-arrays 110A, 110B, 110C and 110D. In some embodiments, vertical scanners 130A and 130B are independently on a same layer of the 3DIC as MDACs 120A, 120B, 120C and 120D. In some embodiments, vertical scanners 130A and 130B are independently on different layers of the 3DIC from sub-arrays 110A, 110B, 110C and 110D; and from MDACs 120A, 120B, 120C and 120D.

In some embodiments, digital memories 140A and 140B are independently on a same layer of the 3DIC as sub-arrays 110A, 110B, 110C and 110D. In some embodiments, digital memories 140A and 140B are independently on a same layer of the 3DIC as MDACs 120A, 120B, 120C and 120D. In some embodiments, digital memories 140A and 140B are independently on different layers of the 3DIC from sub-arrays 110A, 110B, 110C and 110D; and from MDACs 120A, 120B, 120C and 120D.

In some embodiments, ECCs 150A and 150B are independently on a same layer of the 3DIC as sub-arrays 110A, 110B, 110C and 110D. In some embodiments, ECCs 150A and 150B are independently on a same layer of the 3DIC as MDACs 120A, 120B, 120C and 120D. In some embodiments, ECCs 150A and 150B are independently on different layers of the 3DIC from sub-arrays 110A, 110B, 110C and 110D; and from MDACs 120A, 120B, 120C and 120D.

In some embodiments, multiplexer MUX and LVDS I/O are independently on a same layer of the 3DIC as sub-arrays 110A, 110B, 110C and 110D. In some embodiments, multiplexer MUX and LVDS I/O are independently on a same layer of the 3DIC as MDACs 120A, 120B, 120C and 120D. In some embodiments, multiplexer MUX and LVDS I/O are independently on different layers of the 3DIC from sub-arrays 110A, 110B, 110C and 110D; and from MDACs 120A, 120B, 120C and 120D.

By sharing a digital memory, e.g., digital memory 140A, between multiple sub-arrays, e.g., sub-array 110A and sub-array 110C, an overall size of readout circuit 100 is reduced in comparison with a readout circuit which includes a digital memory for each sub-array. The reduced size permits a reduction in size of an image sensor device which includes readout circuit 100. The reduction in size also reduces a size of each sub-array, which in turn decreases a number of pixels per column. As the number of pixels per column decreases, an operating speed of readout circuit 100 increases due to a reduction in the parasitic capacitance introduced by a column readout line connected to the pixels in the column.

In operation, switches SWA, SWB, SWC and SWD are selectively activated by a clock circuit such that one sub-array is connected to a corresponding digital memory at a time. For example, during a first clock cycle switch SWA is activated and switch SWC is not activated, so sub-array 110A is connected to digital memory 140A through MDCA 120A. During a second clock cycle switch SWC is activated and switch SWA is not activated, so sub-array 110C is connected to digital memory 140A through MDAC 120C.

Figure 2:
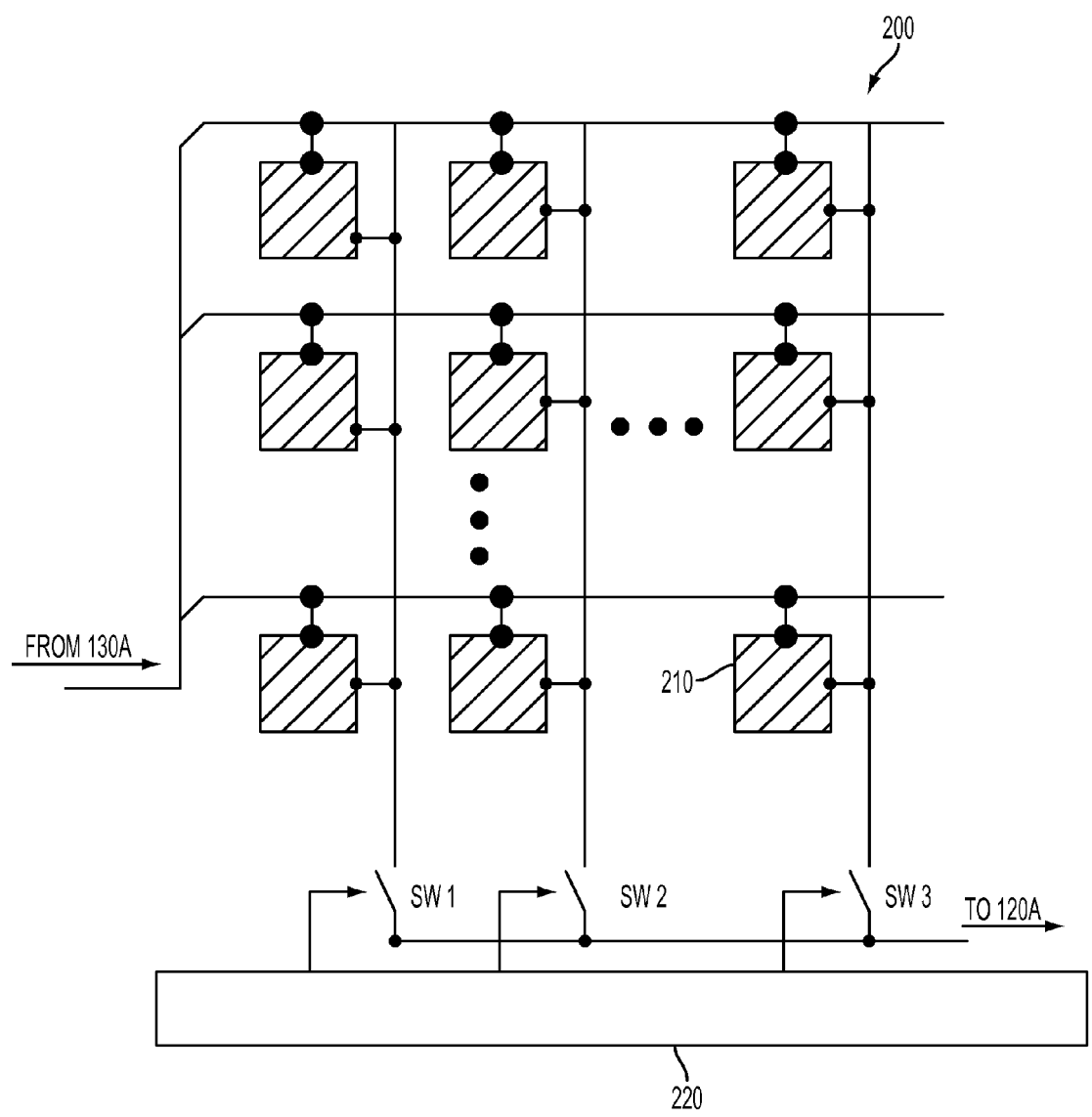
FIG. 2 is a schematic diagram of a pixel array in accordance with some embodiments.

FIG. 2 is a schematic diagram of a pixel array 200 in accordance with some embodiments. Pixel array 200 includes pixels 210 arranged into a plurality of rows and a plurality of columns. FIG. 2 includes a single sub-array, e.g., sub-array 110A. In some embodiments, a full pixel array includes sub-arrays segmented into at least three column segments, i.e., each row of the full pixel array is sub-divided into at least three sections which are able to be read out separately.

Pixel array 200 includes switches SW1, SW2 and SW3, at least one of which is configured to selectively connect a column of pixels 210 to MDAC 120A (FIG. 1). In some embodiments, each of switches SW1, SW2 and SW3 are configured to electively connect a column of pixels 210 to MDAC 120A. A horizontal scanner 220 is configured to selectively activate switches SW1, SW2 and SW3. Each pixel 210 of pixel array 200 is configured to be selectively activated based on a signal received from vertical scanner 130A. Other pixels of a full pixel array are configured to be selectively activated based on a signal receive from other vertical scanners, e.g., vertical scanner 130B.

In operation, each pixel 210 of pixel array 200 is configured to receive incident electromagnetic radiation. As the electromagnetic radiation is incident on at least one pixel 210, a charge accumulates in the pixel. The signal from vertical scanner 130A selectively activates pixels 210 in a row so that pixel 210 in the activated row is connected to a corresponding switch SW1, SW2 or SW3. Horizontal scanner 220 selectively activates switches SW1, SW2, and SW3 to selectively transfer the accumulated charge in the corresponding pixel 210 to MDAC 120A. In some embodiments, horizontal scanner 220 is configured to selectively activate switches SW1, SW2 and SW3 based on a clock signal. For example, during a first clock cycle horizontal scanner 220 activates switch SW1 to connect an activated pixel (activated by vertical scanner 130A) of a first column with MDAC 120A. During a second clock cycle horizontal scanner 220 activates switch SW2 to connect an activated pixel of a second column with MDAC 120A.

Returning to FIG. 1, MDAC 120A in combination with digital memory 140A and ECC 150A, convert the signal received from the activated pixel from an analog signal to a digital signal. The digital signal is then transferred to external circuitry by multiplexer MUX and LVDS I/O.

Figure 3:
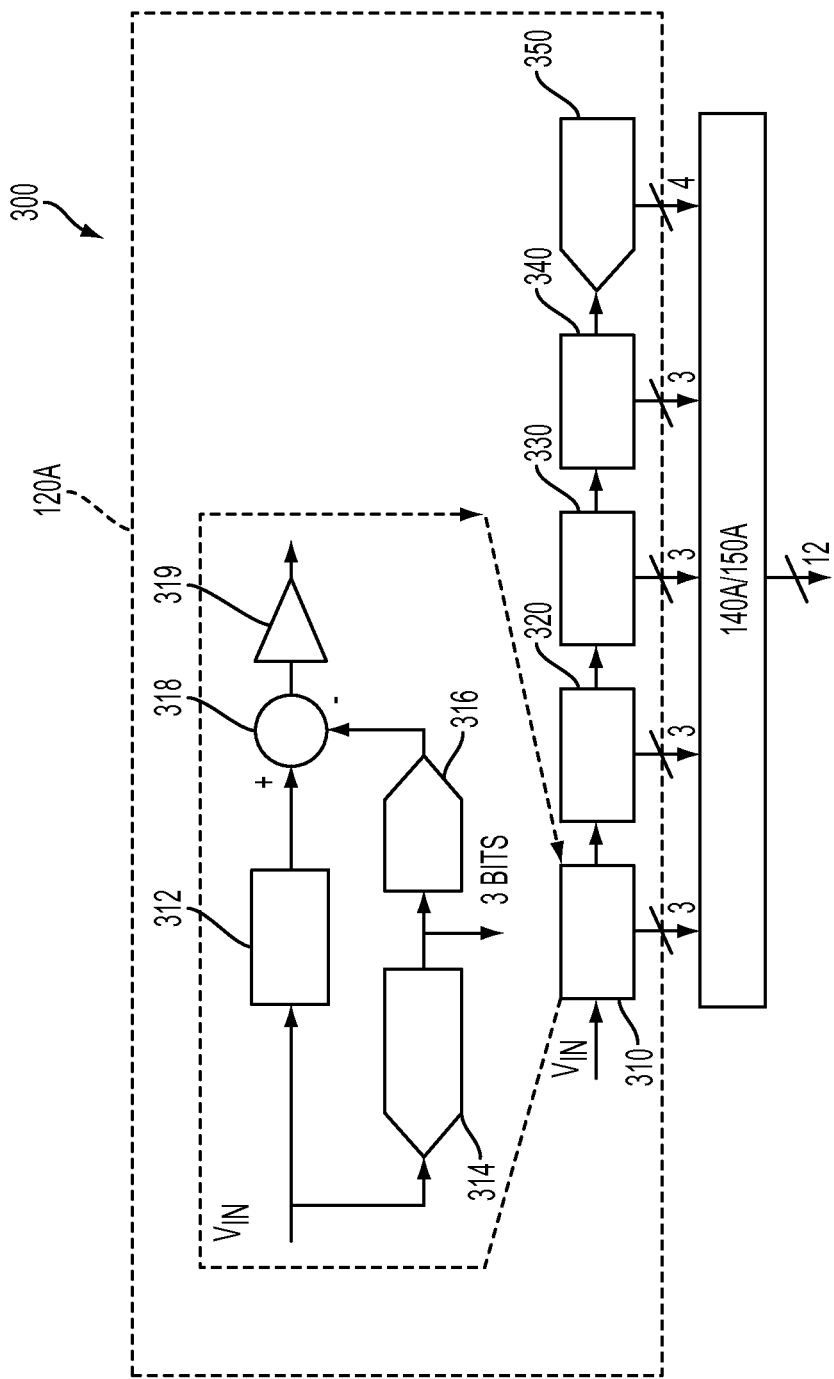
FIG. 3 is a schematic diagram of a pipeline analog to digital converter (ADC) in accordance with some embodiments.

FIG. 3 is a schematic diagram of a pipeline analog to digital converter (ADC) 300 in accordance with some embodiments. ADC 300 includes MDAC 120A connected to digital memory 140A and ECC 150A. MDAC 120A includes a first stage 310 connected in series with a second stage 320, a third stage 330, a fourth stage 340, and a flash ADC 350. In addition to the serial connection, a digital block including digital memory 140A and ECC 150A (FIG. 1) is also configured to receive an output of first stage 310, second stage 320, third stage 330, fourth stage 340 and flash ADC 350. In some embodiments, MDAC 120A includes more or less than four stages. In some embodiments, MDACs 120B, 120C and 120D (FIG. 1) includes a similar structure as MDAC 120A. In some embodiments where first stage 310, second stage 320, third stage 330, fourth stage 340 and flash ADC 350 are part of MDAC 120B, the outputs of the first stage, the second stage, the third stage, the fourth stage and the flash ADC are connected to digital memory 140B and ECC 150B.

First stage 310 is configured to receive an output from sub-array 110A (FIG. 1). A sample-and-hold (S&H) 312 is configured to maintain the output from sub-array 10A steady. A flash ADC 314 is also configured to receive the output from sub-array 110A and convert the received signal into a digital signal. Flash ADC 314 is configured to output the digital signal to digital memory 140A and ECC 150A. Flash ADC 314 is also configured to output the digital signal to a digital to analog converter (DAC) 316. DAC 316 is configured to convert the digital signal back into an analog signal. A signal combiner 318 is configured to substrate an output of DAC 316 from an output of S&H 312 for removing the bits of the output of flash ADC 314 from the output of the S&H. A gain amplifier 319 is configured to receive an output of the signal combiner 318 and output an analog signal to second stage 320. In some embodiments, gain amplifier 319 is configured to increase the amplitude of the output of signal combiner 318 by a factor of four. In some embodiments, gain amplifier 319 is configured to increase the amplitude of the output of signal combiner 318 by a factor of more or less than four.

Second stage 320, third stage 330 and fourth stage 340 include similar structures to that of first stage 310 described above, in some embodiments. Flash ADC 350 is configured to convert residual bits from the output of sub-array 110A into a residual digital signal.

MDACs 120B, 120C and 120D would include a same or similar structure as MDAC 120A. MDACs 120B, 120C and 120D are configured to receive an output from a corresponding sub-array 110B, 110C or 110D.

Figure 4:
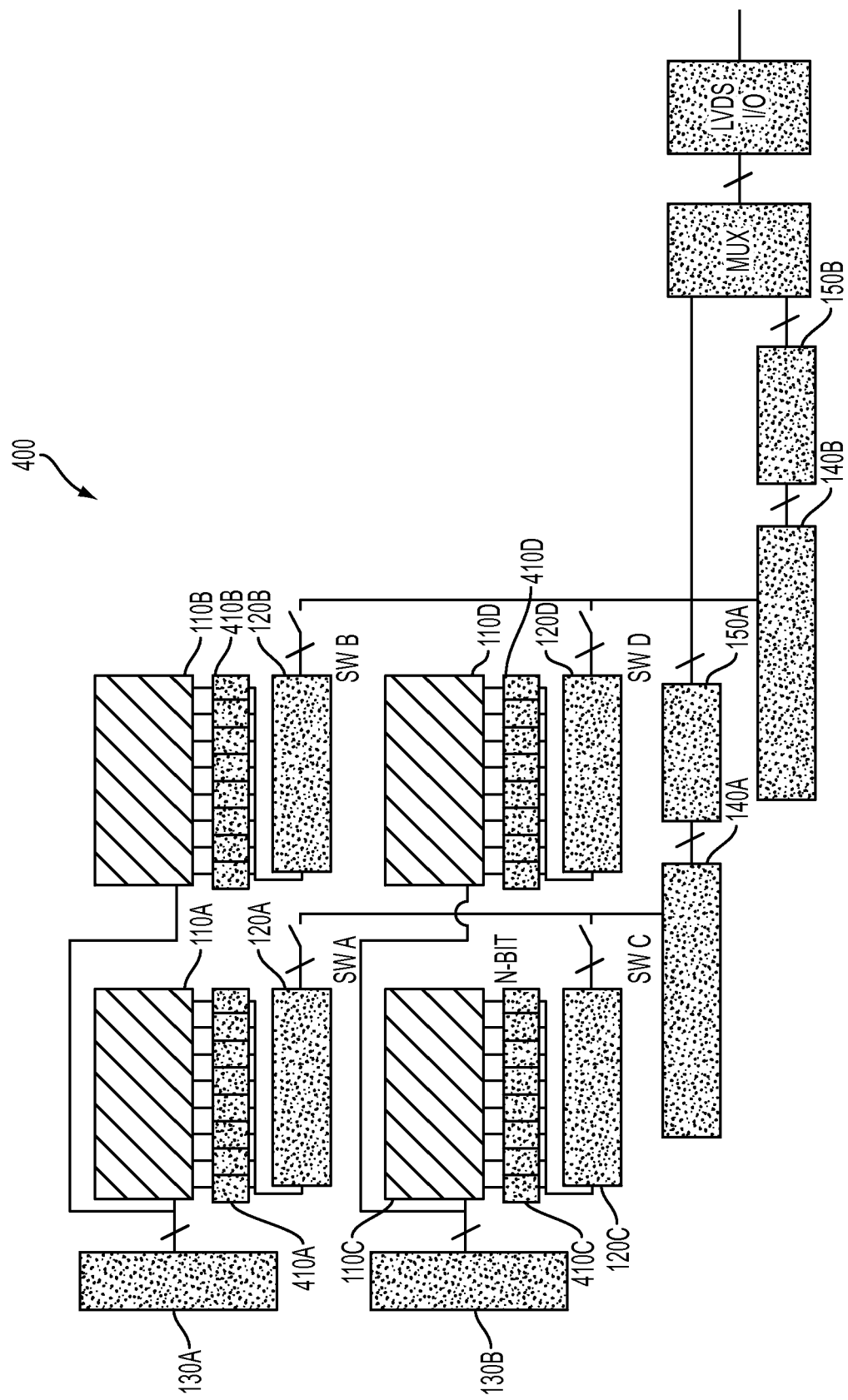
FIG. 4 is a schematic diagram of a readout circuit in accordance with some embodiments.

FIG. 4 is a schematic diagram of a readout circuit 400 in accordance with some embodiments. Readout circuit 400 is similar to readout circuit 100. Similar elements in readout circuit 400 have a same reference number as readout circuit 100. Readout circuit 400 includes a line memory 410A between sub-array 110A and MDAC 120A. Readout circuit 400 includes a line memory 410B between sub-array 110B and MDAC 120B. Readout circuit 400 includes a line memory 410C between sub-array 110C and MDAC 120C. Readout circuit 400 includes a line memory 410D between sub-array 110D and MDAC 120D.

Line memory 410A is configured to receive the output of sub-array 110A and store the information in a row of memory cells. In some embodiments, the memory cells of the row of memory cells include capacitors, flash memory cells, magneto-resistive memory cells, charge-trapping memory cells, or other suitable memory cells. The stored information from line memory 410A is transferred to MDAC 120A in a sequential manner.

In some embodiments, information from sub-array 110A is transferred to line memory 410A in a row-wise manner. The row-wise transfer of information means that a number of memory cells in line memory 410A substantially corresponds to a number of pixels 210 (FIG. 5) in a row of pixels of a sub-array. The information from each pixel 210 is transferred to a corresponding memory cell of line memory 410A and is then transferred to MDAC 120A. In some embodiments, information from line memory 410A is transferred to MDAC 120A in a sequential manner. In some embodiments, information from line memory 410A is transferred to MDAC in a different order from sequentially. When a subsequent row of pixels is scanned, line memory 410A is configured to overwrite the data store in a memory cell.

Figure 5:
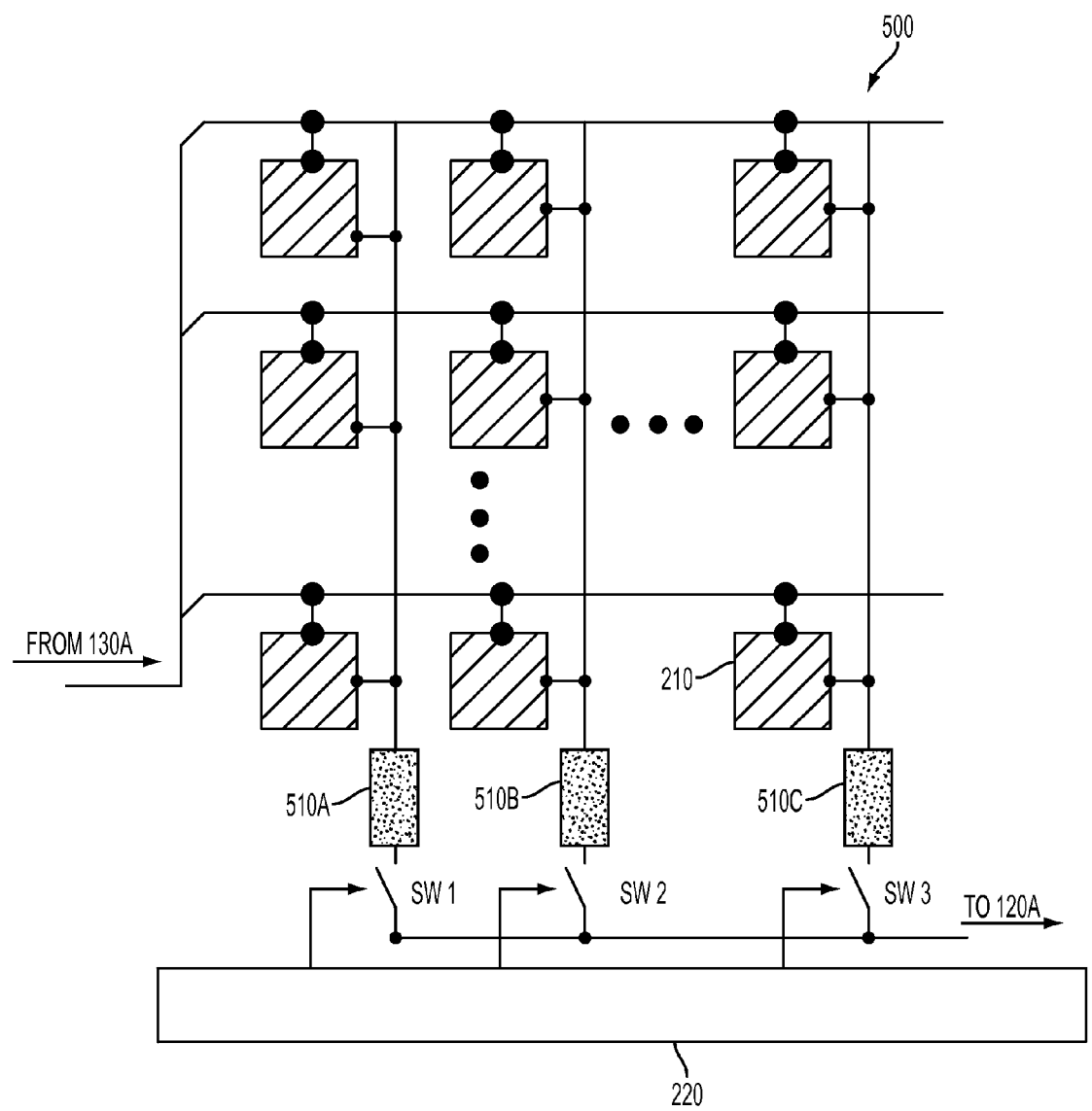
FIG. 5 is a schematic diagram of a pixel array in accordance with some embodiments.

Storing information in line memory 410A helps to increase a rate of reading out information from a pixel array, e.g., pixel array 500 (FIG. 5). During transfer of information of a first memory cell of line memory 410A to MDAC 120A, a second memory cell of the line memory is capable of receiving and storing information from a corresponding pixel for subsequent transfer to MDAC 120A. This procedure helps to reduce delay associated with completely processing information from each pixel sequentially, because steps of the information processing task are performed simultaneously for different memory cells.

In some embodiments, readout circuit 400 is part of a 3DIC. In some embodiments, line memory 410A is part of a same layer of the 3DIC as sub-array 110A. In some embodiments, line memory 410A is part of a same layer of the 3DIC as MDAC 120A. In some embodiments, line memory 410A is part of a different layer of the 3DIC from sub-array 110A and MDAC 120A.

Line memory 410B, line memory 410C and line memory 410D have a same or a similar structure and operation as line memory 410A.

FIG. 5 is a schematic diagram of a pixel array 500 in accordance with some embodiments. Pixel array 500 is similar to pixel array 200 and similar elements have a same reference number. Pixel array 500 includes a memory cell 510A between the first column of pixels 210 and switch SW1. Pixel array 500 includes a memory cell 510B between the second column of pixels 210 and switch SW2. Pixel array 500 includes a memory cell 510C between the third column of pixels 210 and switch SW3. In some embodiments, memory cells 510A, 510B and 510C are each part of a line memory, e.g., line memory 410A (FIG. 4).

In operation, as vertical scanner 130A selective activates a row of pixels 210, information from the activated pixels is transferred to corresponding memory cells 510A, 510B and 510C. Horizontal scanner 220 then selectively activates switches SW1, SW2 and SW3 to transfer the information stored in memory cells 510A, 510B and 510C to MDAC 120A. As vertical scanner 130A actives a different row of pixels 210, the information stored in memory cells 510A, 510B and 510C is replaced with new information from a corresponding pixel of the different row of pixels. In some embodiments, memory cell 510A, 510B, or 510C includes a pair of memory cells. In some embodiments, one of the pair of memory cells stores the reset level from a corresponding pixel 210, and the other of the pair of memory cells stores a signal level of the corresponding pixel. In some embodiments, a readout circuit, e.g., readout circuit 400 (FIG. 4) is configured to determine a difference between the pair of memory cells to reduce a reset noise of the pixel. In some embodiments, a different procedure is used to reduce the reset point of the pixel.

Figure 6:
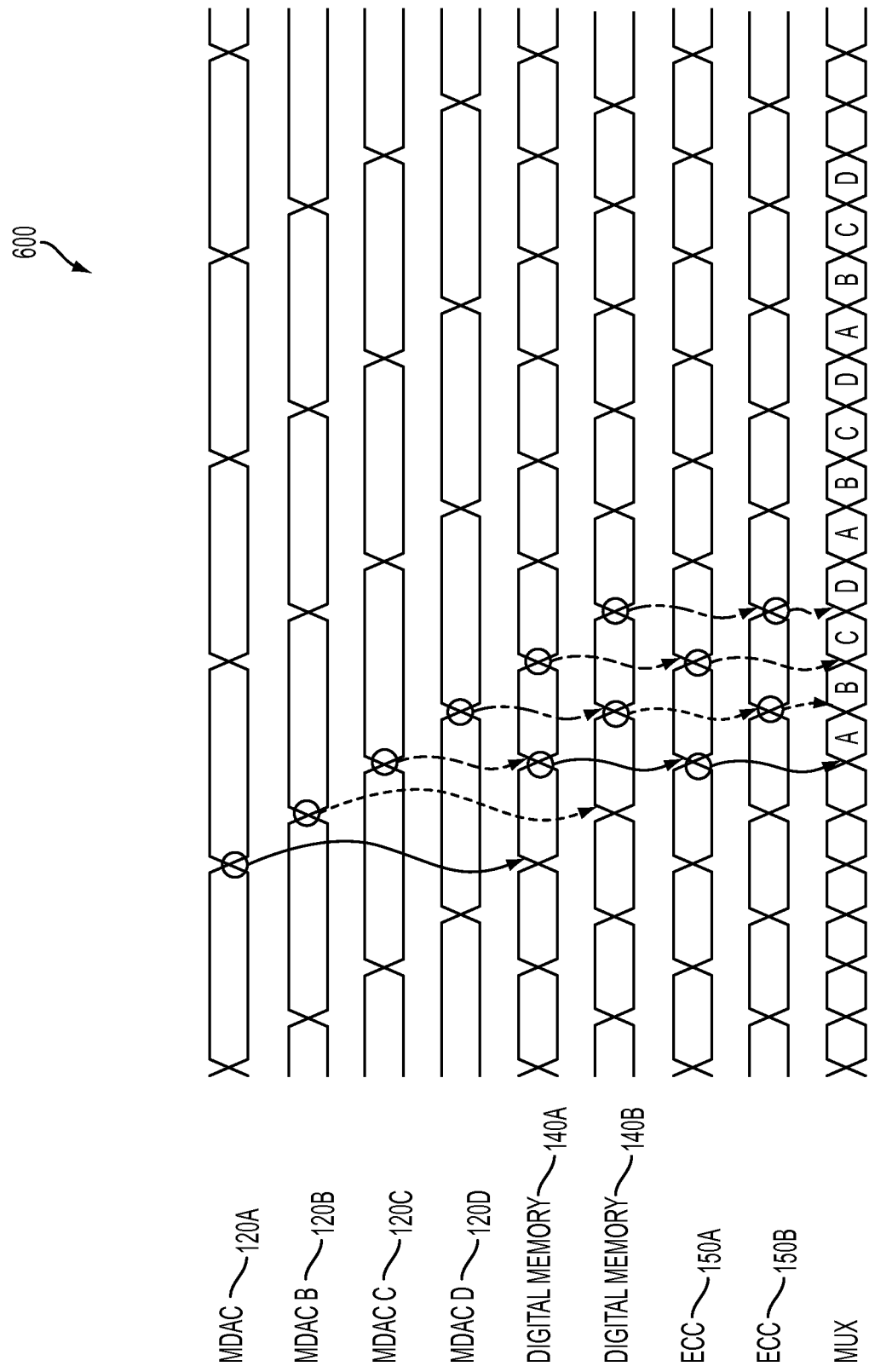
FIG. 6 is a timing diagram of a readout circuit in operation in accordance with some embodiments.

FIG. 6 is a timing diagram 600 of a readout circuit in operation in accordance with some embodiments. Timing diagram 600 provides the waveforms for MDACs 120A, 120B, 120C, and 120D; digital memories 140A and 140B; ECCs 150A and 150B; as well as multiplexer MUX. Timing diagram 600 indicates detailed timing operations of the readout circuit in a first time-sharing-system manner. In the first time-sharing-system manner all MDACs 120A, 120B, 120C and 120D are activated. The first time-sharing-system manner enables faster readout in comparison with other readout processes. Each of the MDACs 120A, 120B, 120C and 120D has n-bit width output. Each digital memory 140A and 140B has an output width which is equal to n divided by the number of shared MDACs, e.g., digital memory 140A shares two MDACs (MDAC 120A and MDAC 120C) in readout circuit 100. Stated another way, if the operating frequency of an MDAC is X Hz, then the operating frequency of a corresponding digital memory would be X*Y Hz, where Y is the number of MDACs which share the corresponding digital memory. For example, in the readout circuit 100 (FIG. 1), MDAC 120A and MDAC 120C share digital memory 140A. As a result, digital memory 140A has an operating frequency two times faster than an operating frequency of MDAC 120A or MDAC 120C. Similarly, because digital memories 140A and 140B both share a single multiplexer MUX, an operating frequency of the multiplexer is two times faster than the operating frequency of digital memory 140A or digital memory 140B.

As indicated by timing diagram 600, a transition of MDAC 120A triggers digital memory 140A to receive and store an output of MDAC 120A at a first cycle of digital memory 140A. The output of MDAC 120A is received and stored within one cycle of digital memory 140A. At a start of a second cycle of digital memory 140A, the stored information is transmitted to ECC 150A to determine the presence of an error and to correct an error in the digital memory if an error is detected. ECC 150A transfers the information received from digital memory 140A to multiplexer MUX to output the value from MDAC 120A during a first cycle of the multiplexer.

A transition of MDAC 120B triggers digital memory 140B to receive and store an output of MDAC 120B at a first cycle of digital memory 140B. The output of MDAC 120B is received and stored within one cycle of digital memory 140B. At a start of a second cycle of digital memory 140B, the stored information is transmitted to ECC 150B to determine the presence of an error and to correct an error in the digital memory if an error is detected. ECC 150B transfers the information received from digital memory 140B to multiplexer MUX to output the value from MDAC 120B during a second cycle of the multiplexer.

A transition of MDAC 120C triggers digital memory 140A to receive and store an output of MDAC 120C at the second cycle of digital memory 140A. The output of MDAC 120C is received and stored within one cycle of digital memory 140A. At a start of a third cycle of digital memory 140A, the stored information is transmitted to ECC 150A to determine the presence of an error and to correct an error in the digital memory if an error is detected. ECC 150A transfers the information received from digital memory 140A to multiplexer MUX to output the value from MDAC 120C during a third cycle of the multiplexer.

A transition of MDAC 120D triggers digital memory 140B to receive and store an output of MDAC 120D at a first cycle of digital memory 140B. The output of MDAC 120D is received and stored within one cycle of digital memory 140D. At a start of a third cycle of digital memory 140B, the stored information is transmitted to ECC 150B to determine the presence of an error and to correct an error in the digital memory if an error is detected. ECC 150B transfers the information received from digital memory 140D to multiplexer MUX to output the value from MDAC 120B during a fourth cycle of the multiplexer.

The transmission process is repeated to cycle through outputs from MDACs 120A, 120B, 120C and 120D, as indicated in timing diagram 600.

Figure 7:
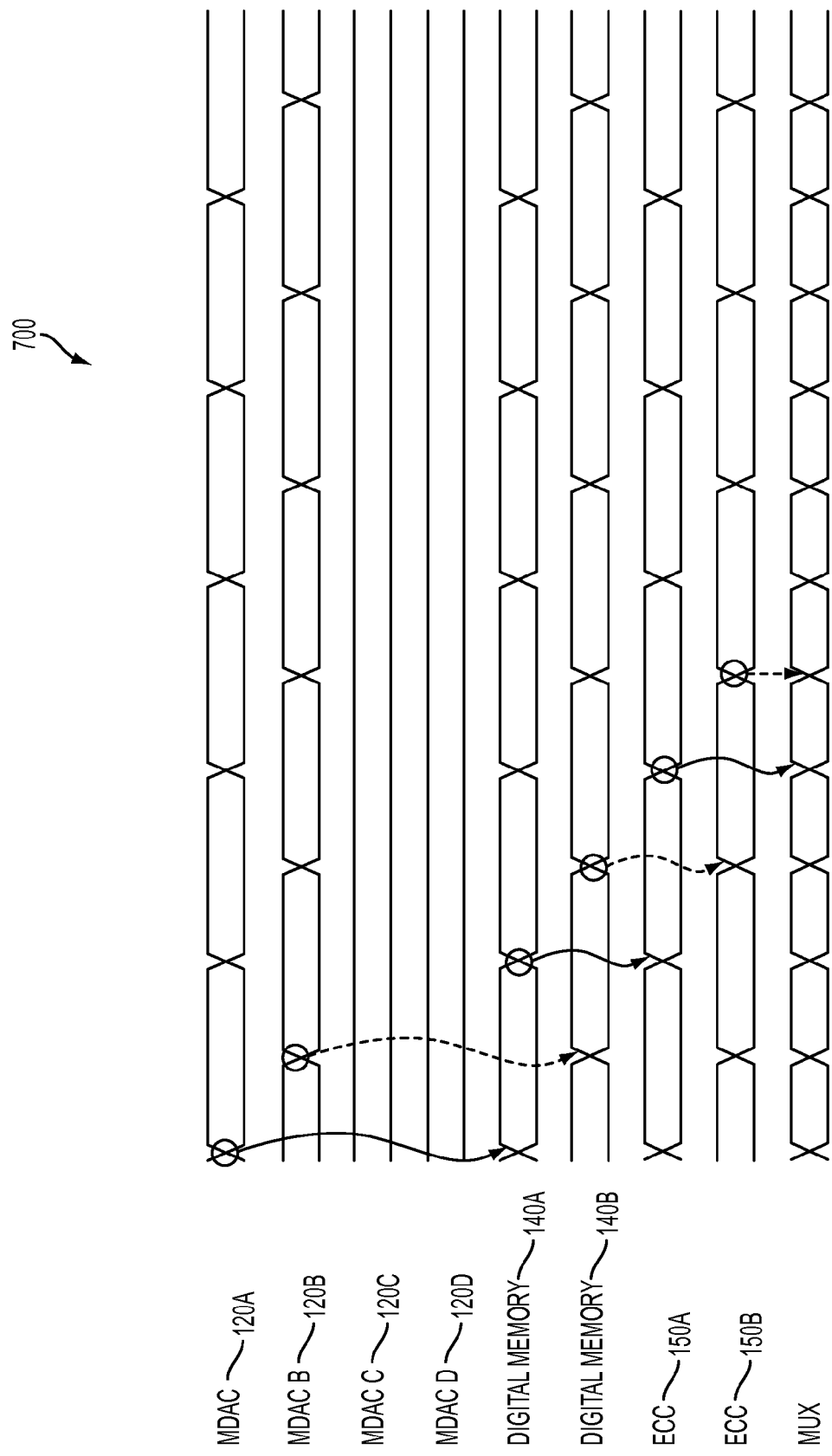
FIG. 7 is a timing diagram of a readout circuit in operation in accordance with some embodiments.

FIG. 7 is a timing diagram 700 of a readout circuit in operation in accordance with some embodiments. Timing diagram 700 provides the waveforms for MDACs 120A, 120B, 120C, and 120D; digital memories 140A and 140B; ECCs 150A and 150B; as well as multiplexer MUX. Timing diagram 700 indicates detailed timing operations of a readout circuit in a second time-sharing-system manner. In the second time-sharing-system manner two of MDACs 120A, 120B, 120C or 120D are activated at a single point in time. The second time-sharing-system manner enables the readout circuit to operate at a lower power in comparison with other readout processes. The decrease in power consumption is due to the smaller parasitic capacitance of the conductive element from a pixel to an MDAC, e.g., pixel 110A to MDAC 120A (FIG. 1), for the reasons discussed above. In comparison with timing diagram 600, timing diagram 700 indicates that an operating frequency of digital memory 140A is equal to an operating frequency of MDAC 120A because MDAC 120C is not activated, i.e., there is no sharing of digital memory 140A by MDAC 120A and MDAC 120C.

As indicated by timing diagram 700, a transition of MDAC 120A triggers digital memory 140A to receive and store an output of MDAC 120A at a first cycle of digital memory 140A. The output of MDAC 120A is received and stored within one cycle of digital memory 140A. At a start of a second cycle of digital memory 140A, the stored information is transmitted to ECC 150A to determine the presence of an error and to correct an error in the digital memory if an error is detected. In a next cycle, ECC 150A transfers the information received from digital memory 140A to multiplexer MUX to output the value from MDAC 120A during a first cycle of the multiplexer.

A transition of MDAC 120B triggers digital memory 140B to receive and store an output of MDAC 120B at a first cycle of digital memory 140B. The output of MDAC 120B is received and stored within one cycle of digital memory 140B. At a start of a second cycle of digital memory 140B, the stored information is transmitted to ECC 150B to determine the presence of an error and to correct an error in the digital memory if an error is detected. In a next cycle, ECC 150B transfers the information received from digital memory 140B to multiplexer MUX to output the value from MDAC 120B during a second cycle of the multiplexer.

Figure 8:
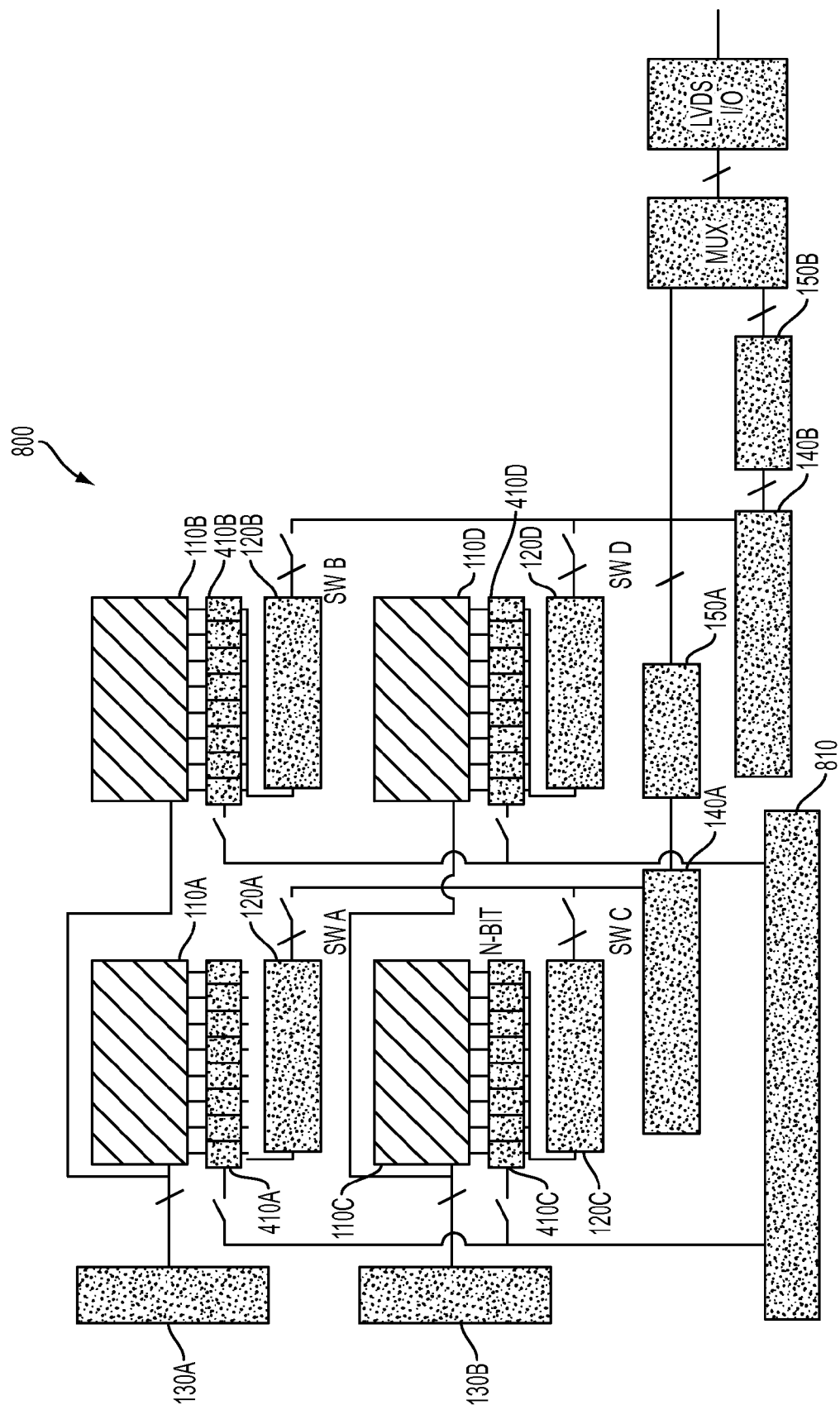
FIG. 8 is a schematic diagram of a readout circuit in accordance with some embodiments.

FIG. 8 is a schematic diagram of a readout circuit 800 in accordance with some embodiments. Readout circuit 800 is similar to readout circuit 400 and similar elements have a same reference number. Readout circuit 800 includes horizontal scanner 810. Horizontal scanner 810 is configured to be selectively connected to line memories 410A, 410B, 410C and 410D. In some embodiments, horizontal scanner 810 is configured to be selectively connected to line memories 410A, 410B, 410C or 410D via a switch. In some embodiments, the switch is configured to be activated by a clock signal. In comparison with readout circuit 400, readout circuit 800 includes a single horizontal scanner for the entire readout circuit 800.

Figure 9:
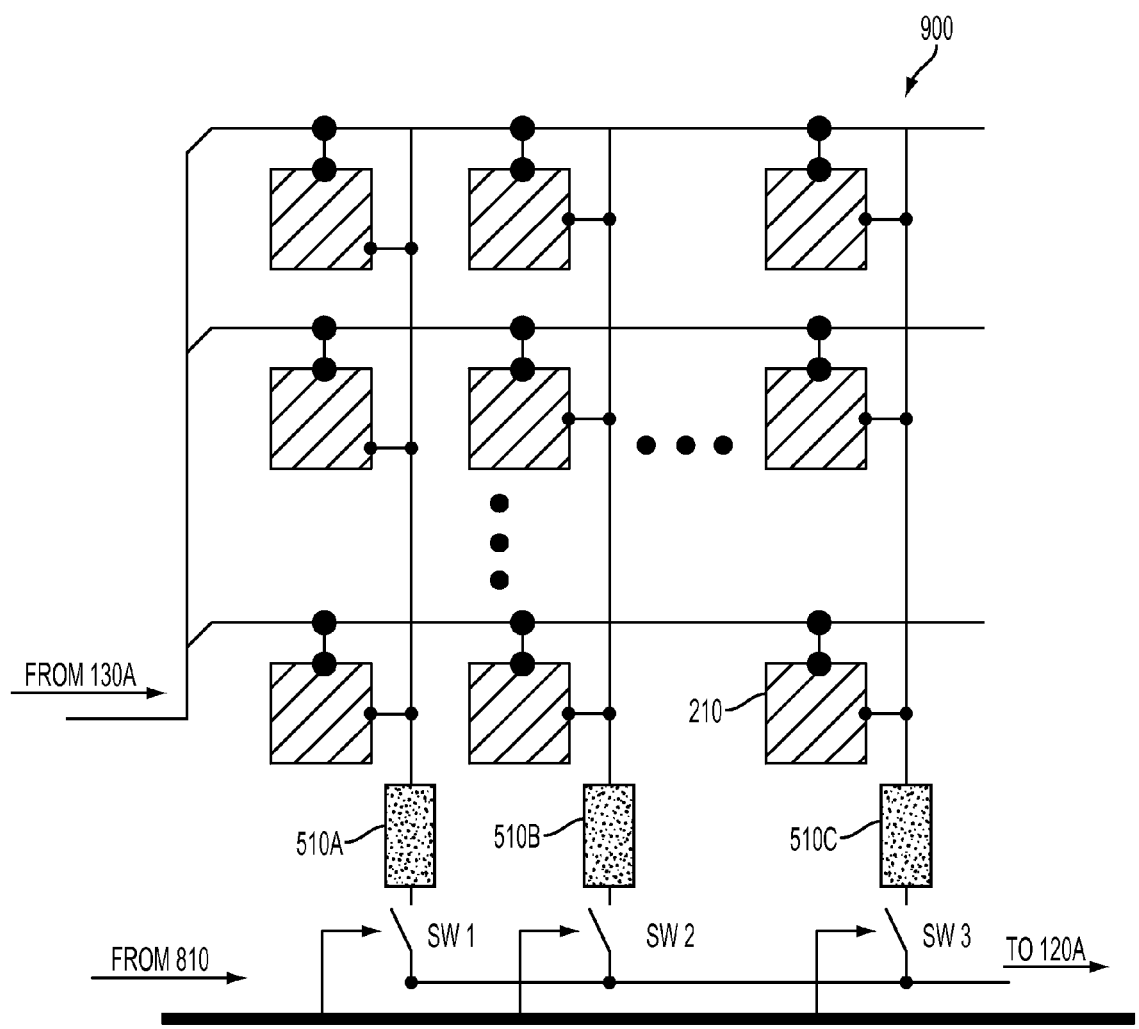
FIG. 9 is a schematic diagram of a pixel array in accordance with some embodiments.

FIG. 9 is a schematic diagram of a pixel array 900 in accordance with some embodiments. Pixel array 900 is similar to pixel array 500, and similar elements have a same reference number. In comparison with pixel array 500, pixel array 900 does not include an integrated horizontal scanner, because horizontal scanner 810 (FIG. 8) is shared by multiple sub-arrays. Pixel array 900 is configured to selectively receive an output of horizontal scanner 810 in order to connect memory cell 510A, memory cell 510B, or memory cell 510 C to MDAC 120A. The arrangement of pixel array 900 reduces an overall size of pixel array 900 in comparison with pixel arrays which include a separate horizontal scanner in each pixel array. However, a conductive element connecting a single horizontal scanner to switches in a plurality of pixel arrays is longer than a conductive element connecting a horizontal scanner to switches within each pixel array. The larger number of pixels per column increases parasitic capacitance in the arrangement which includes a single horizontal scanner. By sharing the horizontal scanner by plural sub-arrays, a number of the pixel per column is reduced due to the smaller array size. Therefore, the readout speed is able to be improved or a driving power of the readout line is able to be reduced.

Figure 10:
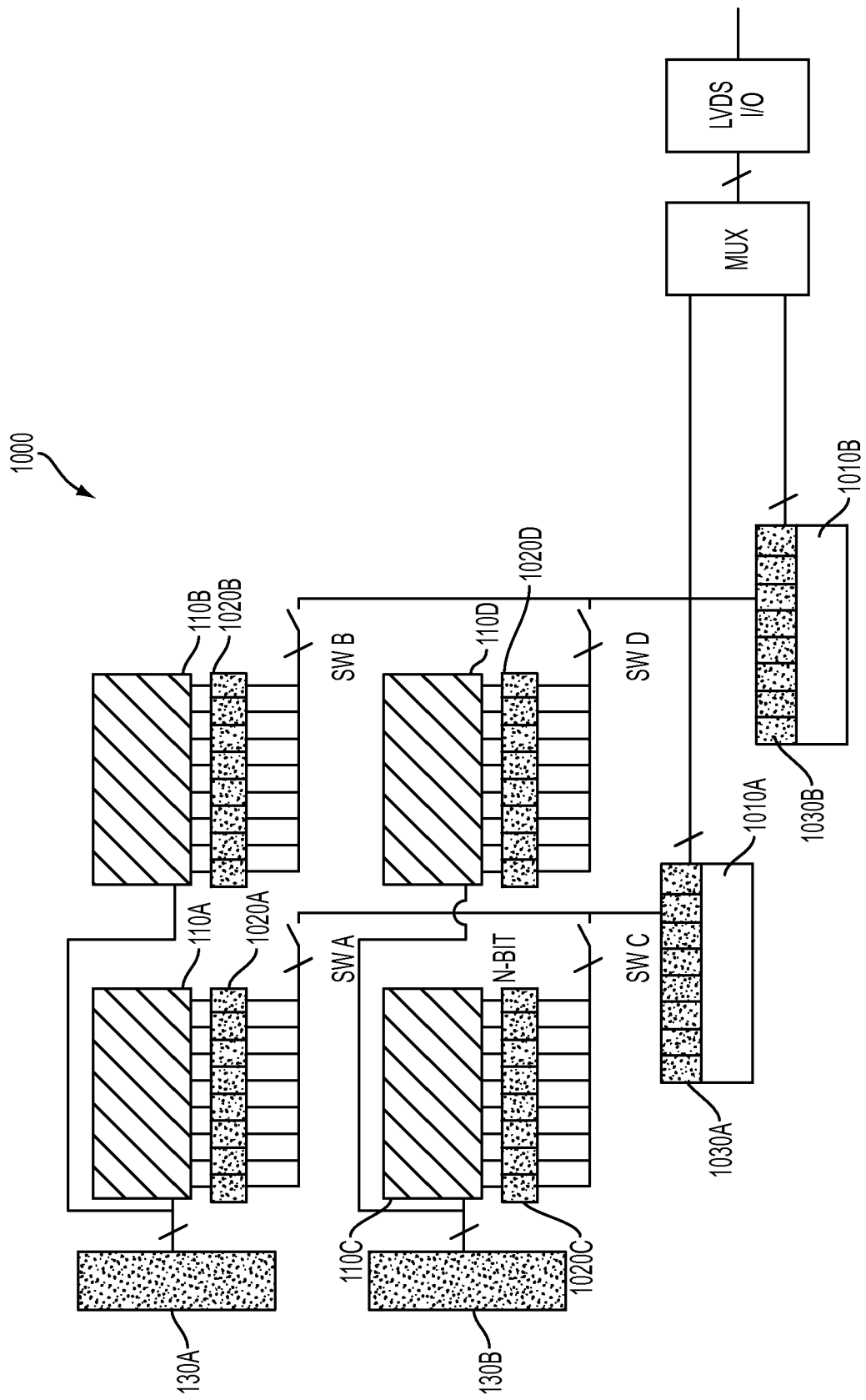
FIG. 10 is a schematic diagram of a readout circuit in accordance with some embodiments.

FIG. 10 is a schematic diagram of a readout circuit 1000 in accordance with some embodiments. Readout circuit 1000 is similar to readout circuit 100, and similar elements have a same reference number. Readout circuit 1000 includes horizontal scanners 1010A and 1010B. Readout circuit 1000 further includes delta-sigma converters 1020A, 1020B, 1020C and 1020D connected to a corresponding sub-array 110A, 110B, 110C or 110D. Readout circuit 1000 further includes decimation filter and memory circuits 1030A and 1030B. Decimation filter and memory circuit 1030A is connected to horizontal scanner 1010A. Decimation filter and memory circuit 1030B is connected to horizontal scanner 1010B. An output of each of decimation filter and memory circuit 1030A and decimation filter and memory circuit 1030B are connected to multiplexer MUX.

Decimation filter and memory circuit 1030A is configured to be selectively connected to delta-sigma converter 1020A via switch SWA. Decimation filter and memory circuit 1030A is configured to be selectively connected to delta-sigma converter 1020C via switch SWC. Decimation filter and memory circuit 1030B is configured to be selectively connected to delta-sigma converter 1020B via switch SWB. Decimation filter and memory circuit 1030B is configured to be selectively connected to delta-sigma converter 1020D via switch SWD.

For a complete column of the pixel array, one decimation filter and memory circuit 1030A is selectively connected to each of two delta-sigma converters 1020A or 1020C through a switch, i.e., switch SWA or switch SWC. In some embodiments, a number of delta-sigma converters per column is three or more. In some embodiments, a number of decimation filters is increased to two or more. When the number of the decimation filters is two or more, then the digital signal from the different delta-sigma converters is able to be transmitted by connecting the signal line in parallel fashion, or by having plural delta-sigma converters share a signal line in a time-sharing manner.

In some embodiments, delta-sigma converters 1020A, 1020B, 1020C and 1020D are each part of a layer of a 3DIC different from sub-arrays 110A, 110B, 110C and 110D. In some embodiments, decimation filter and memory circuits 1030A and 1030B are each part of a same layer of the 3DIC as sub-arrays 110A, 110B, 110C and 110D. In some embodiments, decimation filter and memory circuits 1030A and 1030B are each part of a same layer of the 3DIC as delta-sigma converters 1020A, 1020B, 1020C and 1020D. In some embodiments, horizontal scanners 1010A and 1010B are each part of a same layer of the 3DIC as sub-arrays 110A, 110B, 110C and 110D. In some embodiments, horizontal scanners 1010A and 1010B are each part of a same layer of the 3DIC as delta-sigma converters 1020A, 1020B, 1020C and 1020D.

Figure 11:
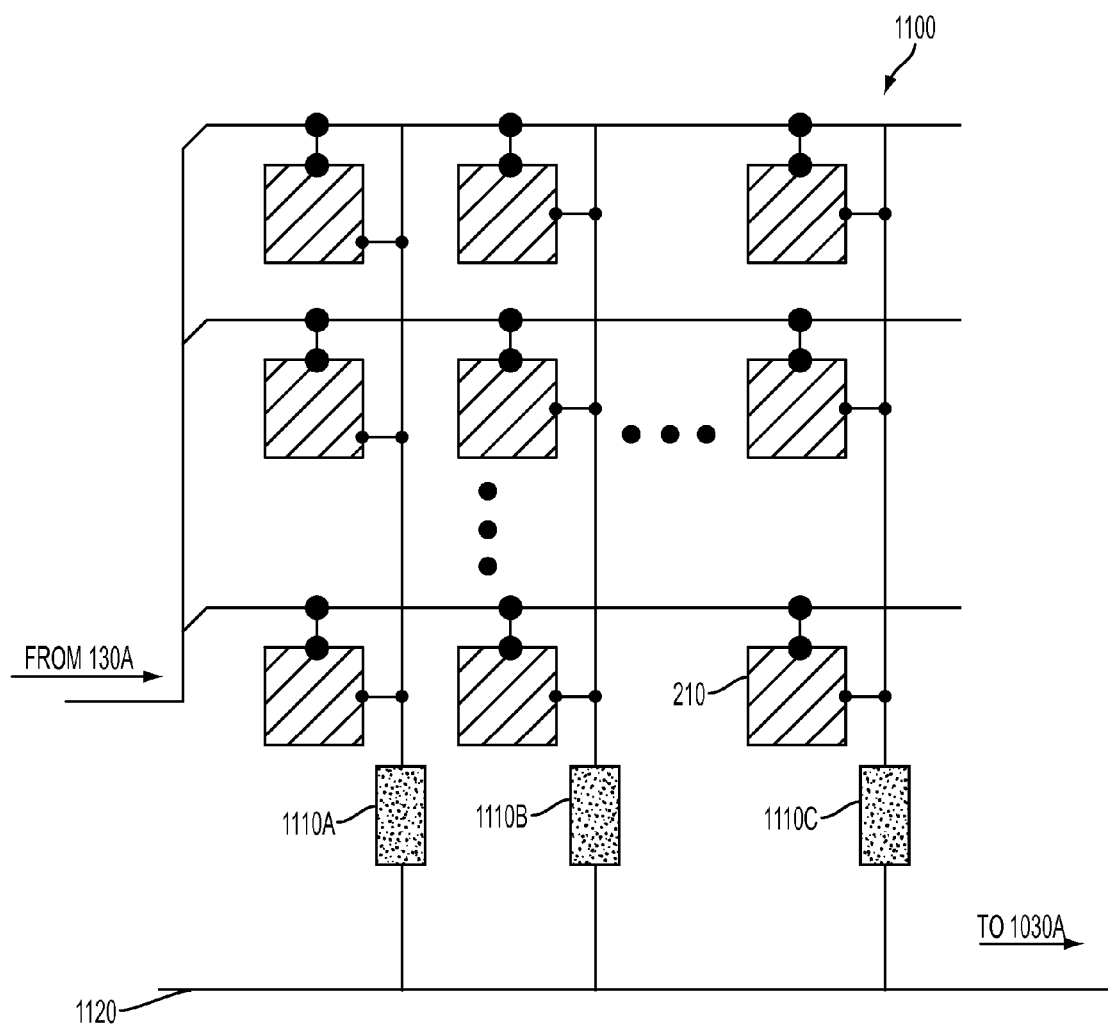
FIG. 11 is a schematic diagram of a pixel array in accordance with some embodiments.

In comparison with readout circuit 100, readout circuit 1000 helps to reduce noise without the inclusion of an additional filter FIG. 11 is a schematic diagram of a pixel array 1100 in accordance with some embodiments. Pixel array 1100 is similar to pixel array 900, and similar elements have a same reference number. Pixel array 1100 includes delta-sigma converters 1110A, 1110B and 1110C. Each of delta-sigma converters 1110A, 1110B and 1110C are connected to a corresponding column of pixels 210. A bus line 1120 is configured to connect each delta-sigma converter 1110A, 1110B and 1110C to decimation filter and memory circuit 1030A (FIG. 10).

Figure 12:
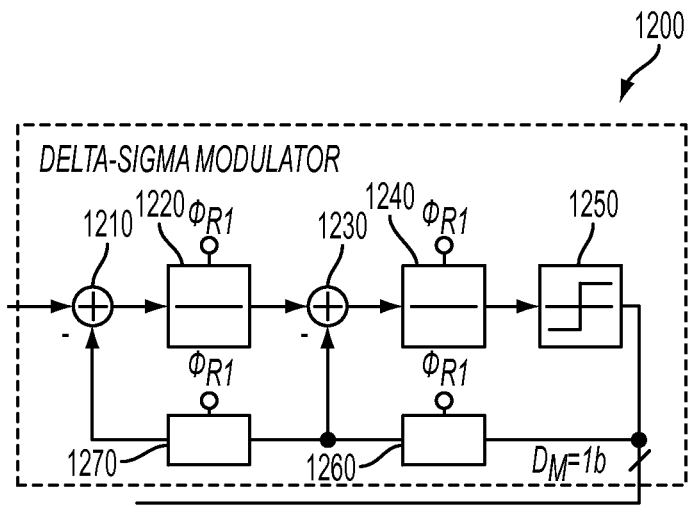
FIG. 12 is a schematic diagram of a delta-sigma converter of a readout circuit in accordance with some embodiments.

FIG. 12 is a schematic diagram of a delta-sigma converter 1200 of a readout circuit in accordance with some embodiments. Delta-sigma converter 1200 includes an adder circuit 1210 configured to receive an output of a sub-array, e.g., sub-array 110A (FIG. 10). An integrator 1220 is configured to receive an output of adder circuit 1210. An adder circuit 1230 is configured to receive an output of integrator 1220. An integrator 1240 is configured to receive an output of adder circuit 1230. A quantizer 1250 is configured to receive an output of integrator 1240. Quantizer 1250 is configured to provide an output to a digital filter, e.g., decimation filter and memory circuit 1030A (FIG. 10). A delay circuit 1260 is configured to receive the output of quantizer 1250. Delay circuit 1260 is configured to provide an output to adder circuit 1230. A delay circuit 1270 is configured to receive the output of delay circuit 1260. Delay circuit 1270 is configured to provide an output to adder circuit 1210.

Figure 13:
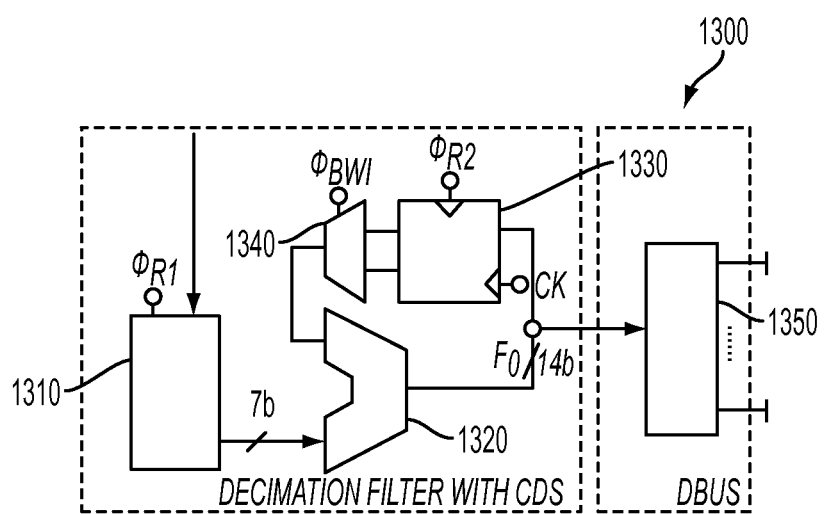
FIG. 13 is a schematic diagram of a decimation filter and memory circuit of a readout circuit in accordance with some embodiments.

FIG. 13 is a schematic diagram of a decimation filter and memory circuit 1300 of a readout circuit in accordance with some embodiments. Decimation filter and memory circuit 1300 is configured to receive an output of a delta-sigma converter, e.g., delta-sigma converter 1200 (FIG. 12) or delta-sigma converter 1020A. Decimation filter and memory circuit 1300 includes a ripple counter 1310 configured to receive the output of the delta-sigma converter. An accumulator circuit 1320 is configured to receive an output of ripple counter 1310. A flip-flop 1330 is configured to receive an output of accumulator circuit 1320. A multiplexer 1340 is configured to receive both outputs of flip-flop 1330. Multiplexer 1340 is configured to provide an output to accumulator circuit 1320. A memory circuit 1350 is configured to receive an output of accumulator circuit 1320. Memory circuit 1350 is configured to store information received from accumulator circuit 1320. Memory circuit 1350 is configured to be accessed by external circuit to read information stored in the memory circuit. In some embodiments, memory circuit 1350 includes a flip-flop, a static random access memory (SRAM), a flash memory array, a magneto-resistive memory array, or another suitable memory circuit.

One of ordinary skill in the art would understand that the sigma-delta ADC describe above is merely an example. In some embodiments, different types of ADC, such as a single slope ADC, a dual slope ADC, a pipeline ADC, a successive approximation register (SAR) ADC, or a cyclic ADC are usable. One of ordinary skill in the art would select the type of ADC based on how the readout circuit is partitioned.

Figure 14:
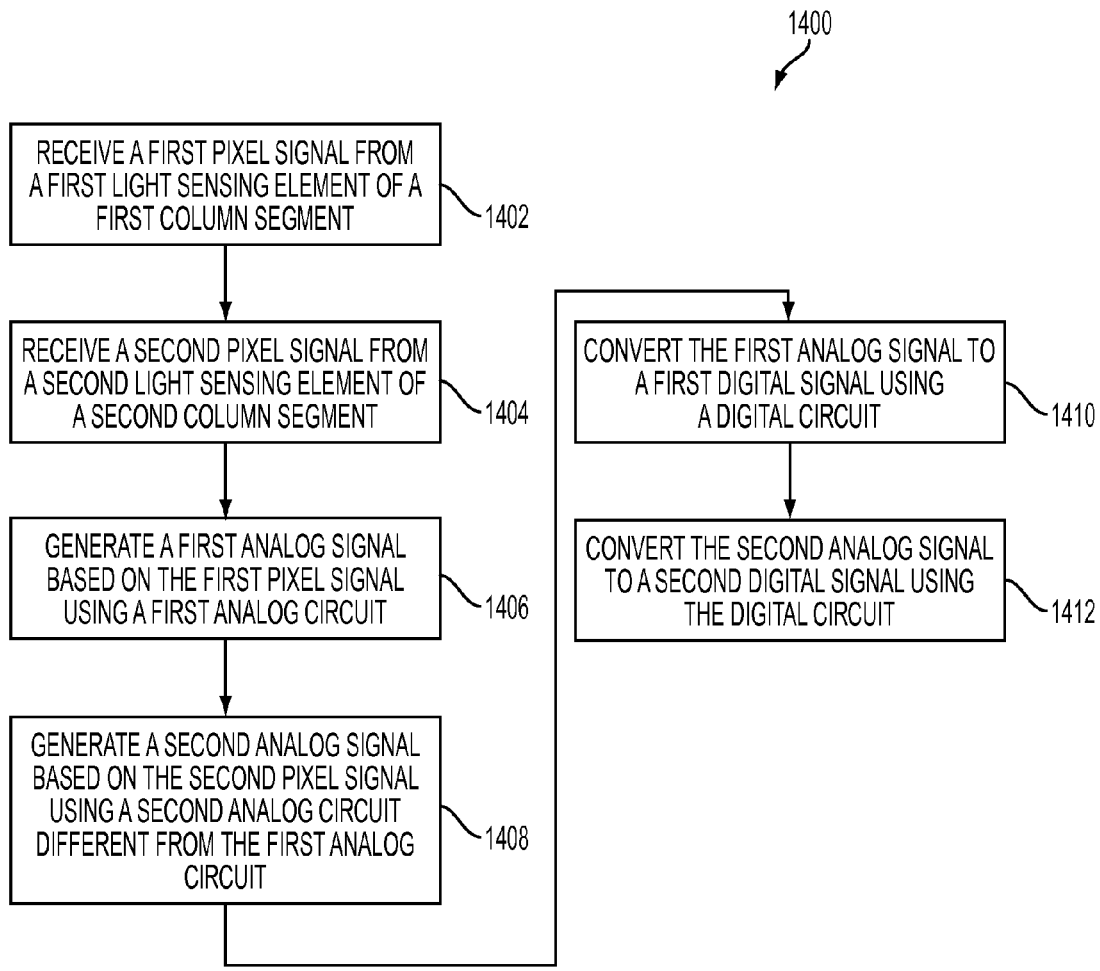
FIG. 14 is a flow chart of a method of using a readout circuit in accordance with some embodiments.

FIG. 14 is a flow chart of a method 1400 of using a readout circuit in accordance with some embodiments. Method 1400 includes receiving a first pixel signal from a first light sensing element of a first sub-array in operation 1402. In some embodiments, the first light sensing element is a pixel, e.g., pixel 210 (FIG. 2). In some embodiments, the first pixel signal is received by a MDAC, e.g., MDAC 120A (FIG. 1). In some embodiments, the first pixel signal is received via a memory cell, e.g., memory cell 510A (FIG. 5). In some embodiments, a vertical scanner, e.g., vertical scanner 130A (FIG. 2), is configured to initiate transfer of the first pixel signal.

Method 1400 continues with operation 1404 in which a second pixel signal from a second light sensing element of a second sub-array is received. In some embodiments, the second light sensing element is a pixel, e.g., pixel 210 (FIG. 2). In some embodiments, the second pixel signal is received by a MDAC, e.g., MDAC 120C (FIG. 1). In some embodiments, the second pixel signal is received via a memory cell, e.g., memory cell 510A (FIG. 5). In some embodiments, a vertical scanner, e.g., vertical scanner 130A (FIG. 2), is configured to initiate transfer of the second pixel signal.

In operation 1406, a first analog signal is generated based on the first pixel signal using a first analog circuit. In some embodiments, the first analog circuit is a MDAC, e.g., MDAC 120A (FIG. 1). In some embodiments, the first analog circuit is a delta-sigma converter, e.g., delta-sigma converter 1010A (FIG. 10).

In operation 1408, a second analog signal is generated based on the second pixel signal using a second analog circuit. The second analog circuit is separate from the first analog circuit. In some embodiments, the second analog circuit is a MDAC, e.g., MDAC 120B (FIG. 1). In some embodiments, the second analog circuit is a delta-sigma converter, e.g., delta-sigma converter 1010B (FIG. 10).

The first analog signal is converted into a first digital circuit using a digital circuit, in operation 1410. In some embodiments, the digital circuit is a digital memory, e.g., digital memory 140A (FIG. 1). In some embodiments, the digital circuit is a decimation filter and memory circuit, e.g., decimation filter and memory circuit 1030A (FIG. 10).

The second analog signal is converted into a second digital circuit using the digital circuit, in operation 1412. The digital circuit converts the first analog signal to the first digital signal and converts the second analog signal to the second digital signal. In some embodiments, the digital circuit is a digital memory, e.g., digital memory 140A (FIG. 1). In some embodiments, the digital circuit is a decimation filter and memory circuit, e.g., decimation filter and memory circuit 1030A (FIG. 10).

One aspect of this description relates to a readout circuit. The readout circuit includes a first analog circuit configured to receive an output of a first sub-array of a pixel array, wherein the first analog circuit is configured to output a first analog signal based on the received output of the first sub-array. The readout circuit further includes a second analog circuit configured to receive an output of a second sub-array of the pixel array, wherein the second sub-array comprises at least one pixel on a same row of the pixel array as at least one pixel of the first sub-array, and the second analog circuit is configured to output a second analog signal based on the received output of the second sub-array. The readout circuit further includes a first digital circuit configured to receive the first analog signal and to convert the first analog signal to a first digital signal, wherein the first digital circuit is further configured to receive the second analog signal and to convert the second analog signal to a second digital signal.

Another aspect of this description relates to a three dimensional integrated circuit (3DIC). The 3DIC includes a pixel array comprising a plurality of pixels arranged in a plurality of rows and a plurality of columns. The pixel array includes a first sub-array comprising at least one pixel in a first row of the pixel array; and a second sub-array comprising at least one pixel in the first row of the pixel array. The 3DIC further includes a first analog circuit configured to receive an output of the first sub-array, wherein the first analog circuit is configured to generate a first analog signal based on the output of the first sub-array. The 3DIC further includes a second analog circuit configured to receive an output of the second sub-array, wherein the second analog circuit is configured to generate a second analog signal based on the output of the second sub-array. The 3DIC further includes a first digital circuit configured to receive the first analog signal and to generate a first digital signal based on the first analog signal, wherein the first digital circuit is further configured to receive the second analog signal and to generate a second digital signal based on the second analog signal.

Still another aspect of this description relates to a method of operation a readout circuit. The method further includes receiving a first pixel signal from a first sub-array, the first sub-array comprising at least one pixel in a first row of a pixel array. The method includes receiving a second pixel signal from a second sub-array, the second sub-array comprising at least one pixel in the first row of the pixel array. The method further includes generating a first analog signal based on the first pixel signal using a first analog circuit, and generating a second analog signal based on the first pixel signal using a second analog circuit different from the first analog circuit. The method further includes converting the first analog signal to a first digital signal using a digital circuit; and converting the second analog signal to a second digital signal using the digital circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A readout circuit comprising:
 a first analog circuit configured to receive an output of a first sub-array of a pixel array, wherein the first analog circuit is configured to output a first analog signal based on the received output of the first sub-array;
 a second analog circuit configured to receive an output of a second sub-array of the pixel array, wherein the second sub-array comprises at least one pixel on a same row of the pixel array as at least one pixel of the first sub-array, and the second analog circuit is configured to output a second analog signal based on the received output of the second sub-array; and
 a first digital circuit configured to receive the first analog signal and to convert the first analog signal to a first digital signal, wherein the first digital circuit is further configured to receive the second analog signal and to convert the second analog signal to a second digital signal.

2. The readout circuit of claim 1, wherein at least one of the first analog circuit or the second analog circuit comprises a multiplying digital to analog converter (MDAC).

3. The readout circuit of claim 1, wherein at least one of the first analog circuit or the second analog circuit comprises a pipeline analog to digital converter (ADC).

4. The readout circuit of claim 1, wherein at least one of the first analog circuit or the second analog circuit comprises a delta-sigma converter, a single slope analog to digital converter (ADC), a pipeline ADC, a dual slope ADC, a successive approximation register (SAR) ADC or a cyclic ADC.

5. The readout circuit of claim 1, wherein the first digital circuit comprises a digital memory.

6. The readout circuit of claim 1, wherein the first digital circuit comprises a decimation filter and a memory circuit.

7. The readout circuit of claim 1, wherein the first digital circuit comprises an error correction circuit and a memory circuit.

8. The readout circuit of claim 1, further comprising:
 a first line memory connected to the first analog circuit, wherein the first analog circuit is configured to receive the output of the first sub-array from the first line memory; and
 a second line memory connected to the second analog circuit, wherein the second analog circuit is configured to receive the output of the second sub-array from the second line memory.

9. The readout circuit of claim 8, further comprising a horizontal scanner, wherein the horizontal scanner is configured to be selectively connected to the first line memory and to be selectively connected to the second line memory.

10. The readout circuit of claim 1, further comprising:
 a third analog circuit configured to receive an output of a third sub-array of the pixel array, wherein the third analog circuit is configured to output a third analog signal based on the received output of the third sub-array;
 a fourth analog circuit configured to receive an output of a fourth sub-array of the pixel array, wherein the fourth sub-array comprises at least one pixel on a same row of the pixel array as at least one pixel of the third sub-array, and the fourth analog circuit is configured to output a fourth analog signal based on the received output of the fourth sub-array;

a second digital circuit configured to receive the third analog signal and to convert the third analog signal to a third digital signal, wherein the second digital circuit is further configured to receive the fourth analog signal and to convert the fourth analog signal to a fourth digital signal.

11. The readout circuit of claim 10, further comprising a multiplexer configured to receive the first digital signal, the second digital signal, the third digital signal and the fourth digital signal and to output an output signal of the readout circuit.

12. The readout circuit of claim 1, wherein the first digital circuit is configured to receive the first analog signal and the second analog signal sequentially.

13. A three dimensional integrated circuit (3DIC) comprising:
  a pixel array comprising a plurality of pixels arranged in a plurality of rows and a plurality of columns, the pixel array comprising:
    a first sub-array comprising at least one pixel in a first row of the pixel array; and
    a second sub-array comprising at least one pixel in the first row of the pixel array;
  a first analog circuit configured to receive an output of the first sub-array, wherein the first analog circuit is configured to generate a first analog signal based on the output of the first sub-array;
  a second analog circuit configured to receive an output of the second sub-array, wherein the second analog circuit is configured to generate a second analog signal based on the output of the second sub-array;
  a first digital circuit configured to receive the first analog signal and to generate a first digital signal based on the first analog signal, wherein the first digital circuit is further configured to receive the second analog signal and to generate a second digital signal based on the second analog signal.

14. The 3DIC of claim 13, wherein the first analog circuit is on a different layer of the 3DIC from the pixel array.

15. The 3DIC of claim 13, wherein the first digital circuit is on a different layer of the 3DIC from the pixel array.

16. The 3DIC of claim 13, wherein the first digital circuit is on a same layer of the 3DIC as the pixel array.

17. The 3DIC of claim 13, further comprising:
  a first line memory electrically connected between the first sub-array and the first analog circuit; and
  a second line memory electrically connected between the second sub-array and the second analog circuit.

18. The 3DIC of claim 13, further comprising:
  a horizontal scanner configured to selectively connect each column of the first sub-array with the first analog circuit in a sequential manner.

19. The 3DIC of claim 13, wherein the first digital circuit is configured to be connected to the first analog circuit and the second analog circuit in a sequential manner.

20. A method of operating a readout circuit, the method comprising:
  receiving a first pixel signal from a first sub-array, the first sub-array comprising at least one pixel in a first row of a pixel array;
  receiving a second pixel signal from a second sub-array, the second sub-array comprising at least one pixel in the first row of the pixel array;
  generating a first analog signal based on the first pixel signal using a first analog circuit;
  generating a second analog signal based on the second pixel signal using a second analog circuit different from the first analog circuit;
  converting the first analog signal to a first digital signal using a digital circuit; and
  converting the second analog signal to a second digital signal using the digital circuit.

* * * * *